(12) United States Patent
Pricer et al.

(10) Patent No.: US 6,713,838 B2
(45) Date of Patent: Mar. 30, 2004

(54) INDUCTIVE FUSE FOR SEMICONDUCTOR DEVICE

(75) Inventors: Wilbur D. Pricer, Charlotte, VT (US); Rosemary A. Previti-Kelly, Burlington, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 10/003,587

(22) Filed: Oct. 29, 2001

(65) Prior Publication Data

US 2002/0037606 A1 Mar. 28, 2002

Related U.S. Application Data

(62) Division of application No. 09/417,289, filed on Oct. 13, 1999, now Pat. No. 6,335,229.

(51) Int. Cl.[7] ............................................... H01L 29/00
(52) U.S. Cl. ....................................................... 257/529
(58) Field of Search .......................................... 257/529

(56) References Cited

U.S. PATENT DOCUMENTS

| | | | |
|---|---|---|---|
| 3,947,934 A | * | 4/1976 | Olson ........................ 29/25.42 |
| 4,021,705 A | | 5/1977 | Lichtblau |
| 4,455,194 A | | 6/1984 | Yabu et al. |
| 5,264,725 A | | 11/1993 | Mullarkey et al. |
| 5,370,766 A | | 12/1994 | Desaigoudar et al. |
| 5,618,750 A | | 4/1997 | Fukuhara et al. |
| 5,760,674 A | | 6/1998 | Gilmour et al. |
| 5,793,096 A | | 8/1998 | Yu et al. |
| 5,795,819 A | | 8/1998 | Motsiff et al. |
| 6,465,880 B1 | * | 10/2002 | Dobashi et al. ............. 257/679 |

* cited by examiner

*Primary Examiner*—Douglas A. Wille
(74) *Attorney, Agent, or Firm*—McGinn & Gibb, PLLC; Anthony Canale, Esq.

(57) ABSTRACT

A method and structure for blowing a fuse including removing an insulator above a fuse link and etching the fuse link.

20 Claims, 7 Drawing Sheets

INDUCTIVE FUSE FOR SEMICONDUCTOR DEVICE

CROSS-REFERENCE TO RELATED APPLICATIONS

This application is a division of U.S. application Ser. No. 09/417,289 filed Oct. 13, 1999, now U.S. Pat. No. 6,335,229.

BACKGROUND OF THE INVENTION

1. Field of the Invention

The present invention generally relates to a fuse structure and more specifically to an inductive fuse.

2. Description of the Related Art

Conventional systems utilize fuses in semiconductor chips to provide redundancy, electrical chip identification and customization of function. For designs having three (or more) layers of wiring, the fuses are typically formed from a segment of one of the wiring layers, e.g. the "last metal" or "last metal minus one" wiring layer. Fusing (i.e., deletion of a segment of metal fuse line) is accomplished by exposing the segment to a short, high intensity pulse of "light" from an infra-red laser. The metal line absorbs energy, superheats, melts and expands, and ruptures any overlaying passivation. The molten metal then boils, vaporizes or explodes out of its oxide surroundings, disrupting line continuity and causing high electrical resistance. A "sensing" circuit is used to detect fuse segment resistance. Sense circuits can be designed to "understand" that fusing has occurred when line resistance increases or line resistance decreases.

To improve signal propagation and overall circuit performance, high conductance materials such as copper are used for interconnect wiring. Specifically, wire resistance is reduced by using copper and this results in a reduction of the RC character of the circuit. Further reduction of RC can be achieved by using low dielectric constant (K) materials as the dielectric between adjacent wiring lines. Examples of low K dielectric materials include porous glass and polyimide nanofoams.

While the above combination of materials yields high performance integrated circuit devices, the low K dielectric materials are mechanically and thermally fragile and can be damaged or collapse under standard laser fuse blow conditions, and the high conductance metals such as copper or silver readily corrode if left exposed to the atmosphere. Dielectric damage and corrosion of the exposed metal can result in degradation of integrated circuit device yield and reliability.

Therefore, there is a need for a new type of fuse structure which can be blown, e.g. opened, without suffering the reliability problems described above.

SUMMARY OF THE INVENTION

It is, therefore, an object of the present invention to provide a structure and method for blowing a fuse that includes removing an insulator above a fuse link and etching the fuse link. The etching includes wet etching or reactive ion etching. The removing includes ablating the insulator using light energy. The light energy includes a laser light or ultra violet light.

Another inventive method is an inductive circuit in which an inductance is alterable. The inductive circuit includes a primary turn, a secondary turn and a shorted turn. Removing a portion of the shorted turn changes the inductance. The programming device is a fuse and the shorted turn is a fuse link. The secondary turn is positioned between the primary turn and the shorted turn. A current in the shorted turn prevents coupling between the primary turn and the secondary turn. The primary turn and the second turn include aligned openings and the shorted turn includes a portion extending over the aligned openings.

Another aspect of the invention is a fuse that includes a primary turn, a secondary turn and a shorted turn, wherein removing a portion of the shorted turn changes an inductance of the fuse. The primary turn includes a first wire positioned in a first plane, the first wire having two ends and an inner and an outer periphery, the wire having a loop shape such that the two ends are in close proximity to one another. The secondary turn includes a second wire position in a second plane, the second wire having two ends and an inner and an outer periphery, the second wire having a loop shape such that the ends are in close proximity to one another, the inner periphery of the second wire aligning substantially over the inner periphery of the first wire and the outer periphery of the second wire aligning substantially over the outer periphery of the first wire. The shorted turn includes a third wire contained in a plane having an inner and an outer periphery, and is a closed loop, the inner periphery of the third wire aligning substantially over the inner periphery of the second wire and the outer periphery of the third wire aligning substantially over the outer periphery of the second wire. The fuse includes a first insulator between the first wire and the second wire and a second insulator between the second wire and the third wire.

This structure and process is superior to conventional fuses because the fragile low K dielectric is not exposed to the high internal pressures and high local temperatures that are part of the laser deletion of a segment of metal line. Therefore, blowing the fuse does not damage the surrounding dielectric material. Further, the active link of the inductive fuse is isolated from the remainder of the fuse and device circuitry, i.e. there is no physical connection between that feature and other circuits in the device. Once opened, the inductive fuse and the remainder of the device wiring is insensitive to corrosion of the exposed, opened fuse element. Corrosion in the form of dendritic growth cannot occur as there is no DC bias across the opened fuse structure. Corrosion in the form of metal conversion (oxidation) is isolated to the active fuse link.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

To overcome the foregoing problems, the inventive fuse uses the principle of changing the inductance of a structure and then sensing that change. In other words, the invention comprises an unblown fuse which has a certain inductance which changes when the fuse is blown. The sensing circuit accurately detects this change in the inductance.

The invention described below may be used in place of any conventional fuse in any conventional structure and is especially useful with easily corroded metals, such as copper, or low K dielectrics, such as polyimide nanofoams or porous glasses.

Figure 20:
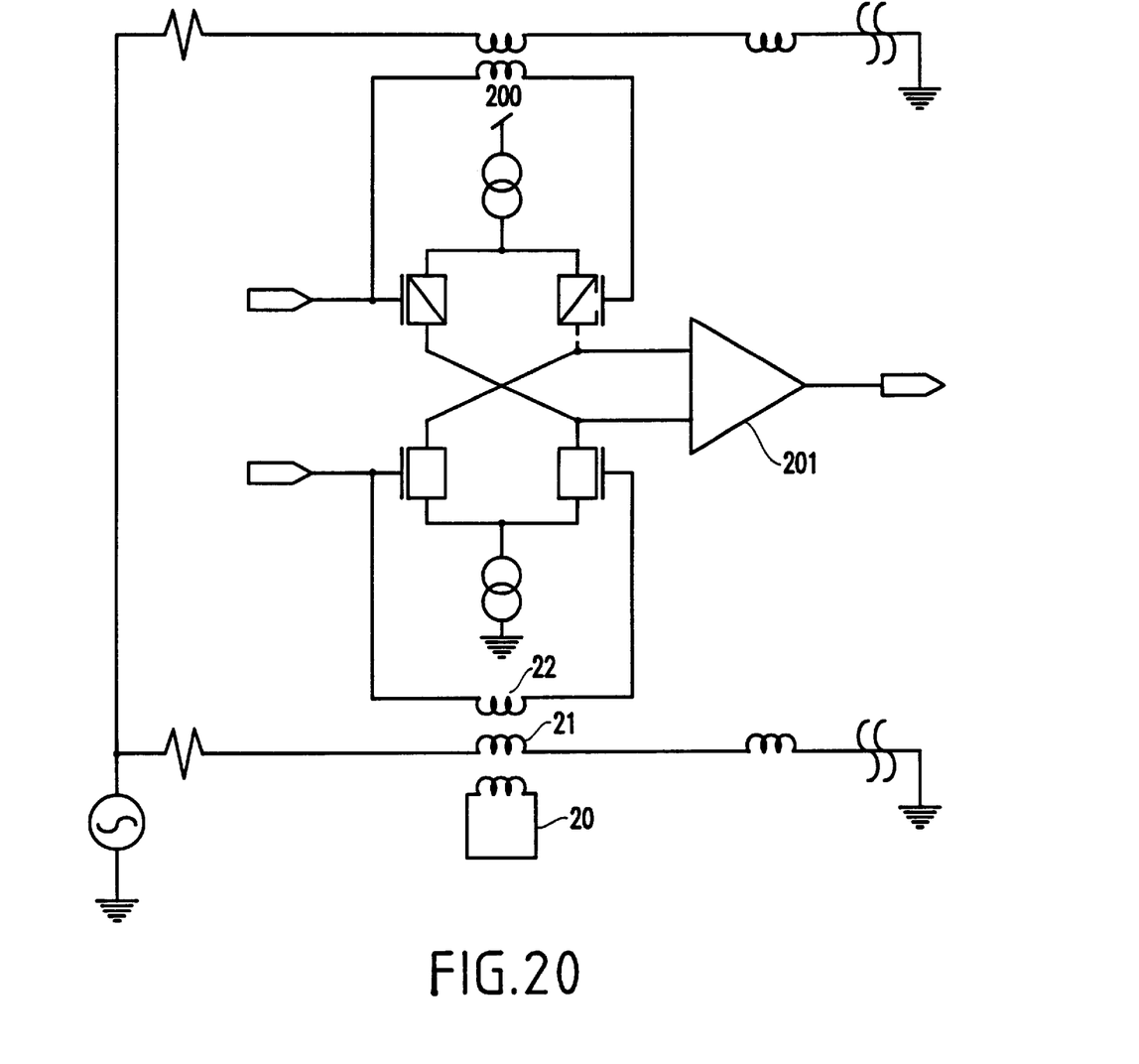
FIG. 20 is a schematic diagram of a sensing circuit according to the invention.

Referring now to FIGS. 1–7, the invention blows a fuse by changing the inductance of a multi-element inductor device that includes a shorted turn 20 (the actual fuse element), a secondary turn 21, and a primary turn 22. When the fuse is blown, shorted turn 20 is opened to allow coupling between the secondary turn 21 and the primary turn 22. The sensing circuit (an example of which is shown in FIG. 20) senses this change in inductance.

Figure 1:
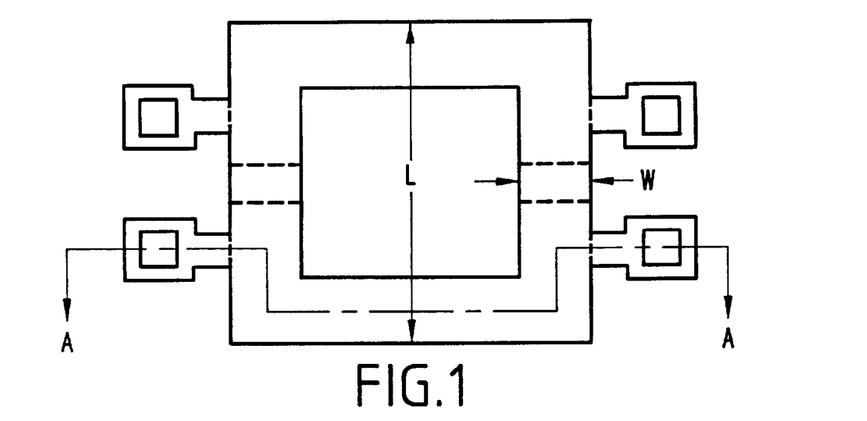
FIG. 1 is a schematic diagram of a top view of the inductive fuse according to the invention.

More specifically, FIG. 1 is a top view of a completed inductive fuse device of with square loops having a length and width represented by "L" and a horizontal thickness represented by "W". W and L could be any size to accommodate a particular application. For example, in one embodiment values for L could be $100\mu$ and W could be 1.0 to $10\mu$.

Figure 2:
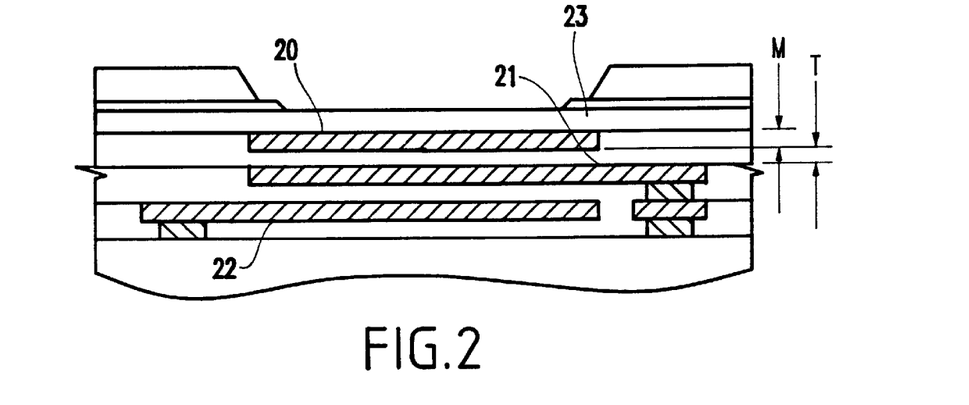
FIG. 2 is a schematic diagram of a side view of the inductive fuse according to the invention.

FIG. 2 is a sectional view thru AA of FIG. 1 showing the shorted turn 20, the secondary turn 21 and the primary turn 22. The loops 20–22 have a vertical thickness represented by "M", separated by a dielectric 23 which has a thickness represented by "T". M and T could be any size to accommodate a particular application. For example, in one embodiment values for M and T could be in the range of 0.5 to $2.0\mu$. The insulators referred to herein can be either conventional dielectrics like silicon dioxide or polymide, or for maximum circuit performance, low K dielectrics such as such as polyimide nanofoams or porous glasses can be used. Similarly, the conductive wires 20, 22 could comprise any conductor such as metal, alloy, polysilicon, etc.

As long as the shorted turn 20 is intact it will act to short the secondary turn 21. The shorted turn 20 sets up an opposing current to that in the primary turn 22 which substantially limits any coupling between the secondary 21 and primary 22 loops. To the contrary, when a portion of the shorted turn 20 is removed, the opposing current is substantially stopped which dramatically increases the coupling between the secondary 21 and primary 22 loops.

Figure 5:
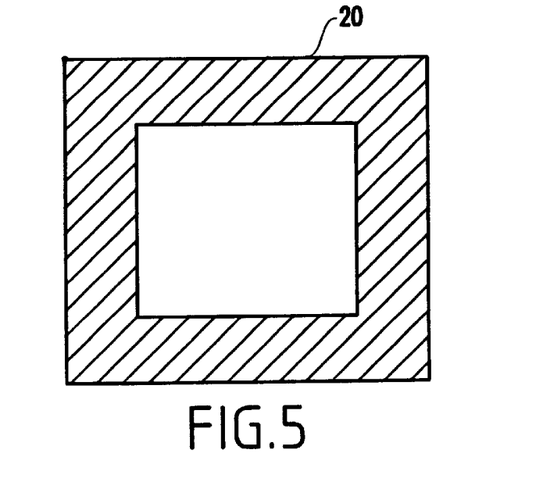
FIG. 5 is a schematic diagram of a top view of the shorted turn of the inductive fuse according to the invention.
Figure 6:
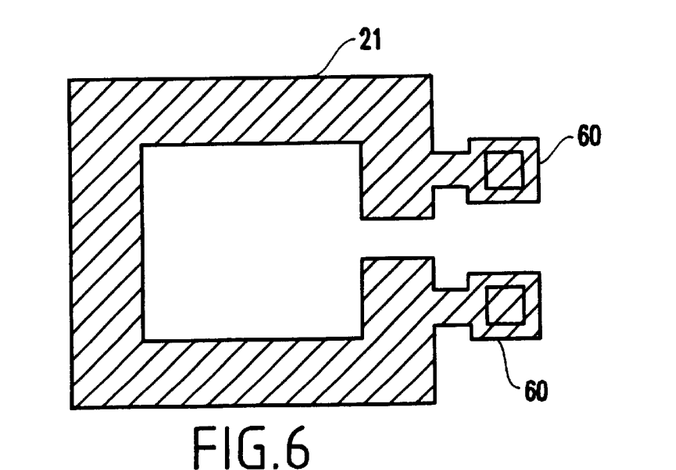
FIG. 6 is a schematic diagram of a top view of the primary turn of the inductive fuse according to the invention.
Figure 7:
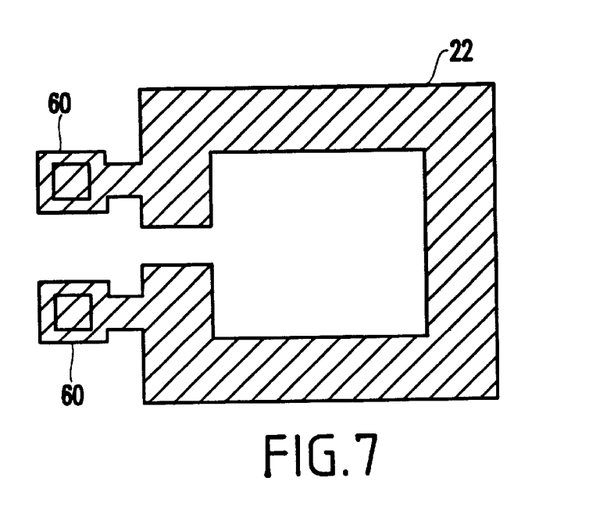
FIG. 7 is a schematic diagram of a top view of the secondary turn of the inductive fuse according to the invention.

FIGS. 5 thru 7 show the individual turns in top view. The shorted turn 20, FIG. 5, is illustrated as a simple square but, as would be known by those ordinarily skilled in the art given this disclosure, could be any shape to accommodate a particular application. The secondary 21 and primary 22, shown in FIGS. 6 and 7, are open turns with extending tabs 60 for connection to sense circuits. Again the shapes of the secondary 21 and primary 22 loops are not limited to those shown in the Figures, but could be any shape to accommodate a particular application as would be known by those ordinarily skilled in the art given this disclosure.

Figure 3:
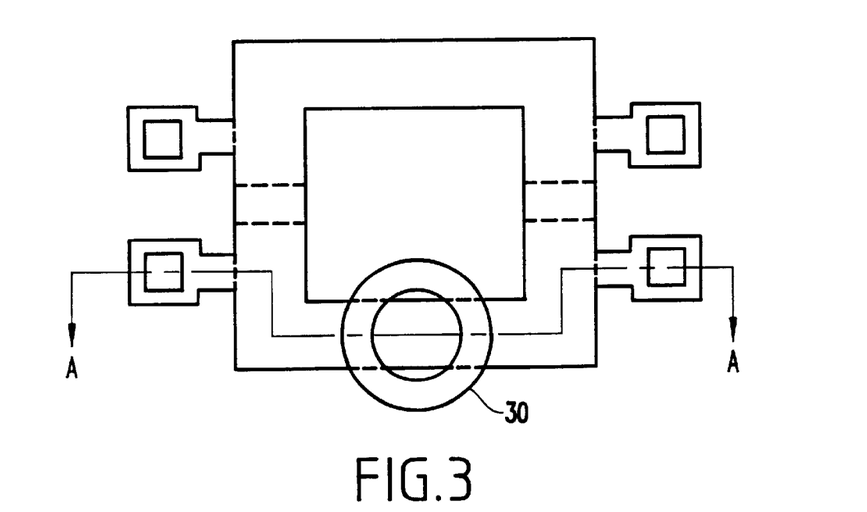
FIG. 3 is a schematic diagram of a top view of the inductive fuse according to the invention.
Figure 4:
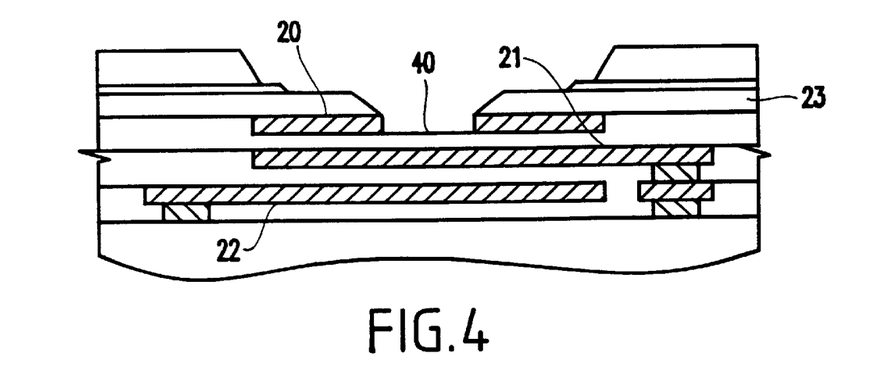
FIG. 4 is a schematic diagram of a side view of the inductive fuse according to the invention.

FIG. 3 is a top view of the device in FIGS. 1 and 2 after the shorted turn 20 has been cut, as shown by the circles 30 (e.g., after the fuse has been blown). The inventive fuse may be blown in several ways. For example, conventional laser blowing techniques can be used to remove a portion 30 of the shorted turn 20, as shown in FIG. 4. More specifically, FIG. 4 is a sectional view thru AA of FIG. 3 showing the shorted line open 40.

Figure 8:
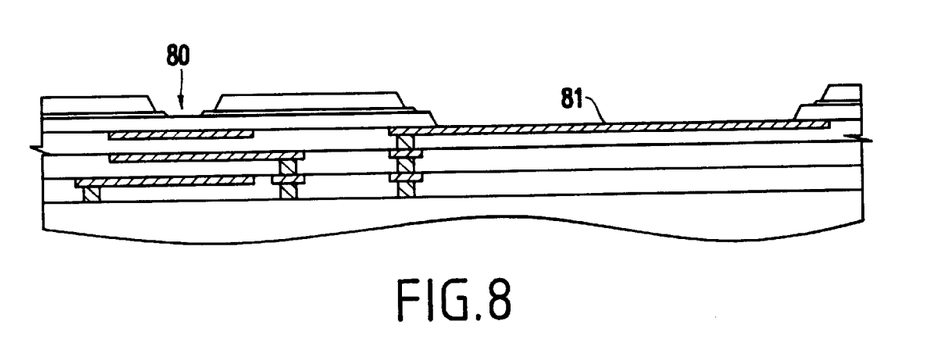
FIG. 8 is a schematic diagram of a side view of a portion of the inductive fuse illustrating the process for blowing the inductive fuse according to the invention.
Figure 9:
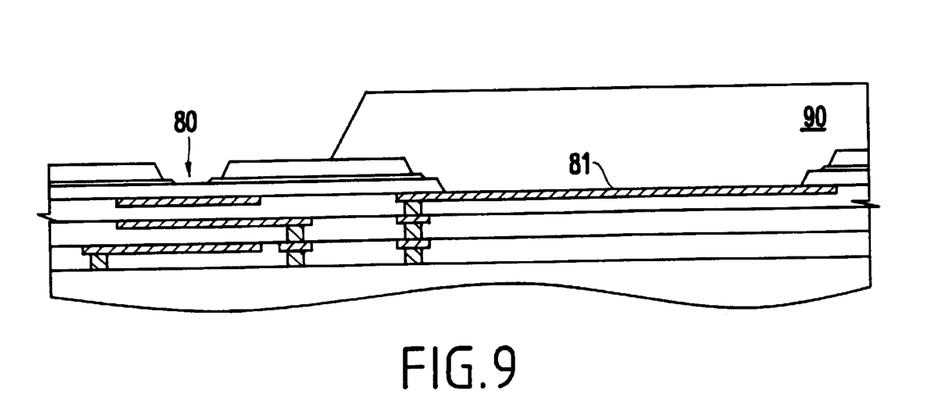
FIG. 9 is a schematic diagram of a side view of a portion of the inductive fuse illustrating the process for blowing the inductive fuse according to the invention.

Alternatively, the invention includes a novel process of blowing the fuse by opening the dielectric and etching the shorted turn 20. FIGS. 8–12 illustrate such an etching method for opening the shorted turn 20. In FIG. 8, a fuse 80 (such as the inductive fuse shown in FIG. 1) and a pad 81 are shown. In FIG. 9, a protective resist 90 is applied and patterned (using any conventional masking technique, such as photolithography) to cover the pad 81.

Figure 10:
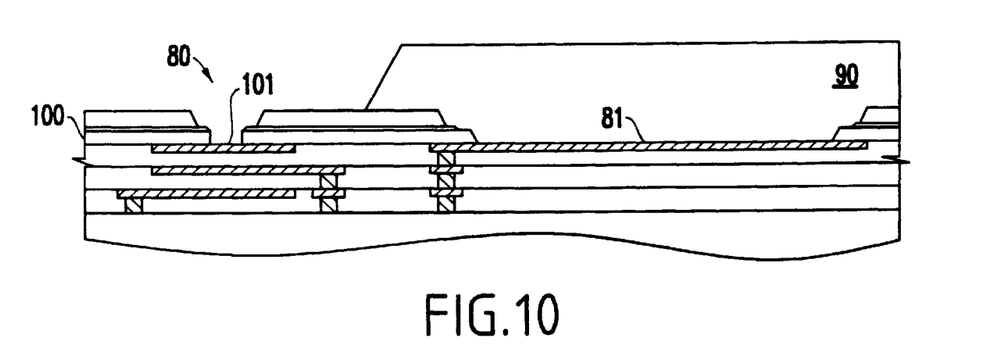
FIG. 10 is a schematic diagram of a side view of a portion of the inductive fuse illustrating the process for blowing the inductive fuse according to the invention.

In FIG. 10, the dielectric 100 is removed to expose the fuse material 101 using any conventional removal technique, such as a Reactive Ion Etching (RIE) process. As an alternative to etching, if the dielectric 100 is a low K dielectric it may be ablated using a laser of appropriate wavelength, typically between 150 nm and 400 nm. All fuses 80 to be "blown" are so exposed. The energy of the light source or the length of the link 101 may be adjusted to ensure that no metal lying under the level of the fuse 80 is exposed.

Figure 11:
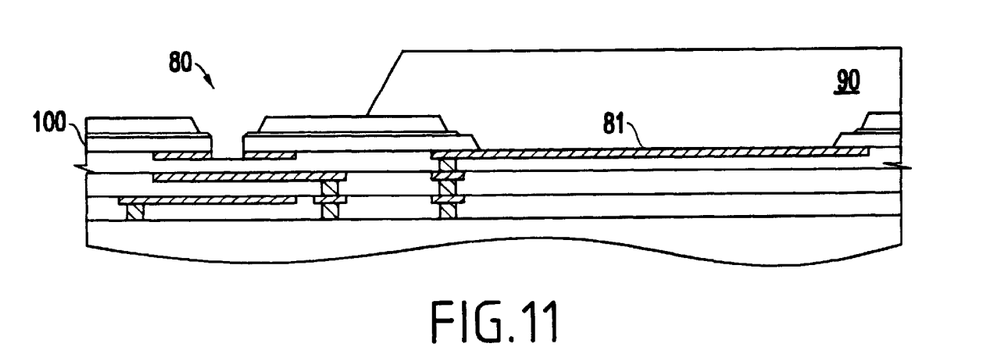
FIG. 11 is a schematic diagram of a side view of a portion of the inductive fuse illustrating the process for blowing the inductive fuse according to the invention.

In FIG. 11, the fuse material 101 is etched and removed thus completing the fuse "blow". Etching may be "wet", using a solution appropriate to the metal wiring, e.g. a solution containing ammonium persulfate if the wiring is copper or "dry", e.g. reactive ion etch (RIE) using, for example, an etchant gas containing $BCL_3$ if the wiring is aluminum. A sequence of "wet" and "dry" etches may also be used.

This etching process is selective to the underlying insulator. In other words, the chemical etching solution (or RIE) removes the conductive material of the fuse link 101 at a much higher rate than it removes the insulator material. Therefore, the invention substantially reduces the probability that any underlying (or surrounding) structures will be affected by the fusing process. While specific etchants are mentioned above, other similar selective etching processes, well known to those ordinarily skilled in the art, can be used depending upon the conductor/insulator makeup and upon the specific application involved.

Figure 12:
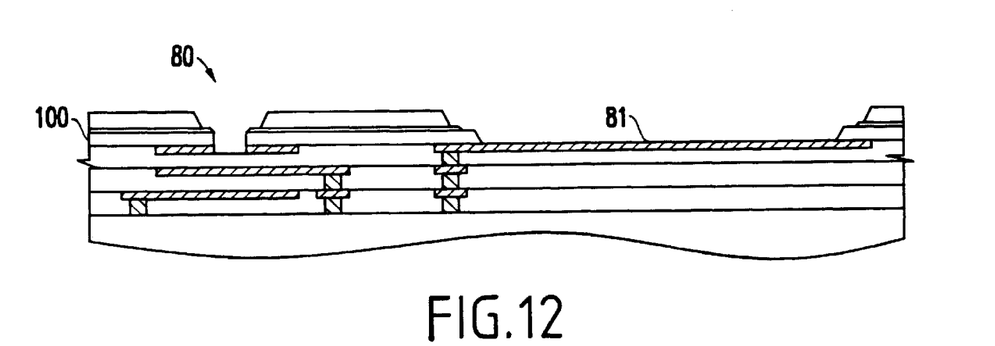
FIG. 12 is a schematic diagram of a side view of a portion of the inductive fuse illustrating the process for blowing the inductive fuse according to the invention.

Finally, in FIG. 12, the resist is stripped away to expose the pad 81 and conventional processing continues. For example, if the final metal is copper, steps need be taken to protect the pad from direct exposure to resist by using a protective film over the pad.

A second embodiment of the invention is shown in FIGS. 13–19. As mentioned above, the invention is not limited to the shapes shown in the attached Figures but is equally applicable to any desired shape depending upon the specific application involved. For example, the embodiment includes a different layout for the transformer, where the laser spot can be placed inside the coil to blow the fuse and reduce the chance of damaging the underlying secondary turn 21. Such a structure is especially useful if the fusible link 20, 101 is to be blown in a conventional laser melting process.

Figure 13:
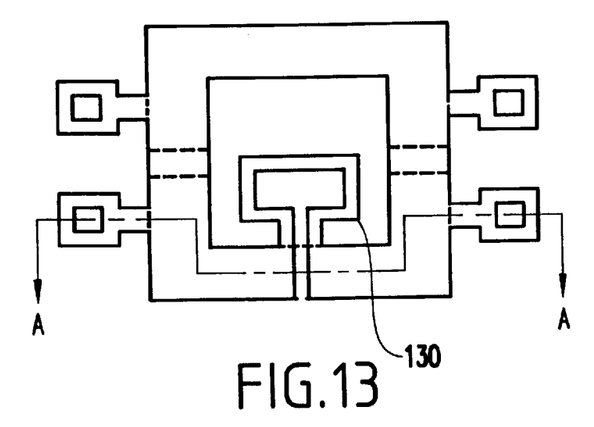
FIG. 13 is a schematic diagram of a top view of an alternative embodiment of the inductive fuse according to the invention.
Figure 14:
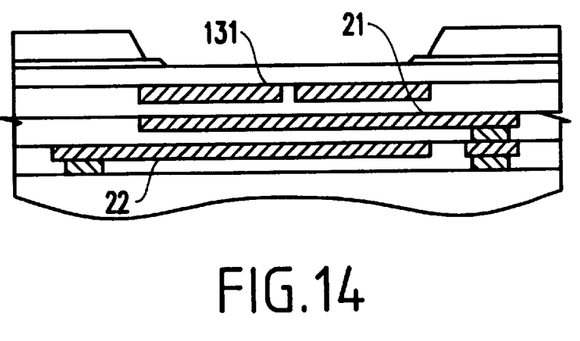
FIG. 14 is a schematic diagram of a side view of an alternative embodiment of the inductive fuse according to the invention.

More specifically, FIG. 13 is a top view of a completed inductive fuse device according to the second embodiment and illustrates the shorted turn 131 that includes an internal convolution 130. FIG. 14 is a sectional view thru AA of FIG. 1 showing the shorted turn 131, the secondary turn 21 and the primary turn 22. As mentioned above, as long as the shorted turn 131 is intact, it will act to short the secondary turn 21, setting up an opposing current to that in the primary 22 and there will be very little electrical coupling between the secondary 21 and primary 22 loops.

Figure 17:
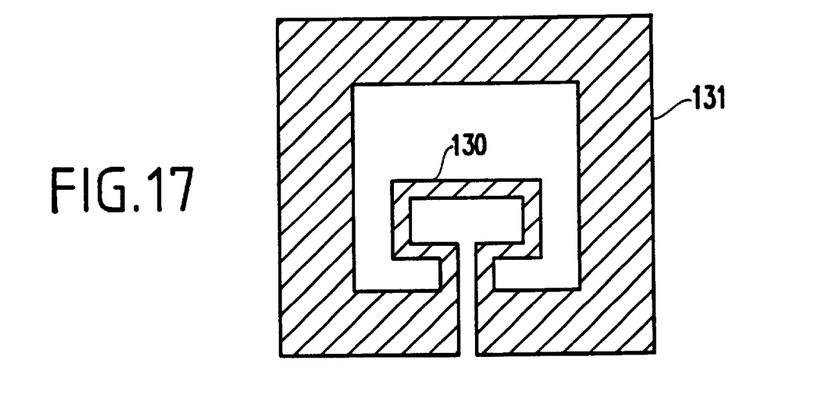
FIG. 17 is a schematic diagram of a top view of the shorted turn of an alternative embodiment of the inductive fuse according to the invention.
Figure 18:
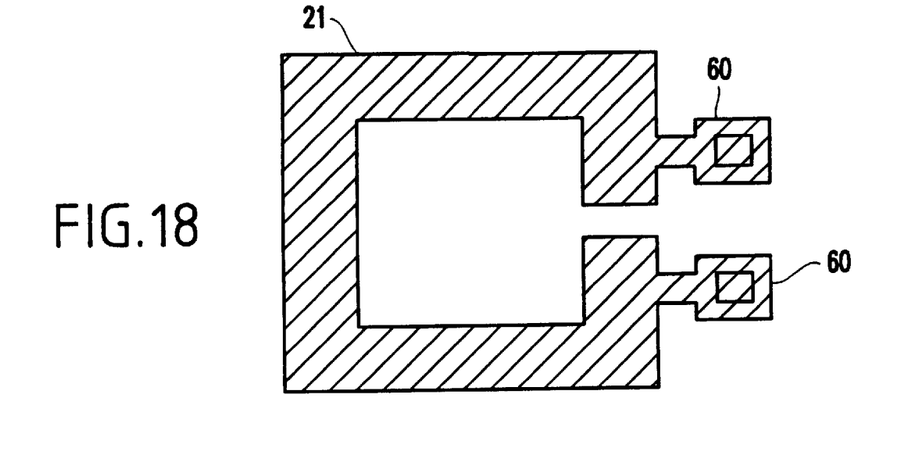
FIG. 18 is a schematic diagram of a top view of the primary turn of an alternative embodiment of the inductive fuse according to the invention.
Figure 19:
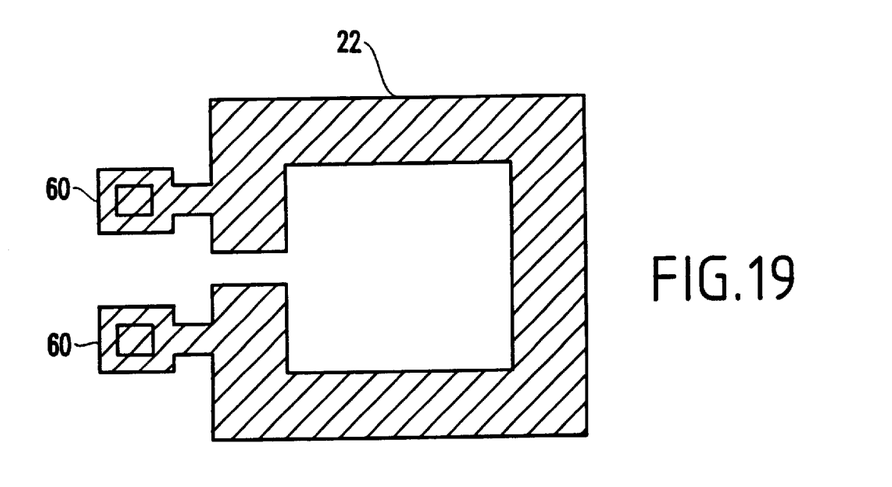
FIG. 19 is a schematic diagram of a top view of the secondary turn of an alternative embodiment of the inductive fuse according to the invention.

FIGS. 17–19 show the individual turns in top view. The shorted turn 131 and internal convolution 130 are illustrated in FIG. 17. The secondary 21 and primary 22 are substantially similar to the structures shown in FIGS. 6 and 7.

Figure 15:
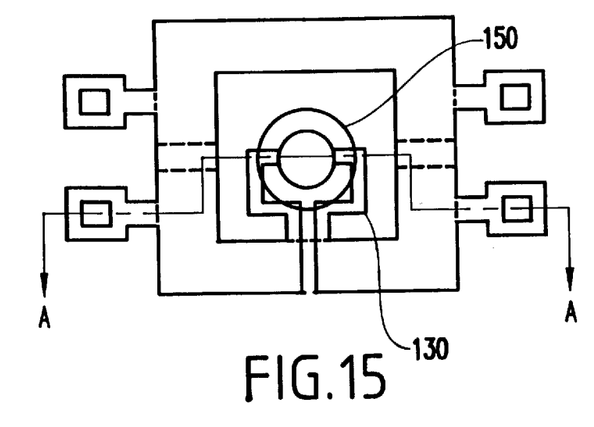
FIG. 15 is a schematic diagram of a top view of an alternative embodiment of the inductive fuse according to the invention.
Figure 16:
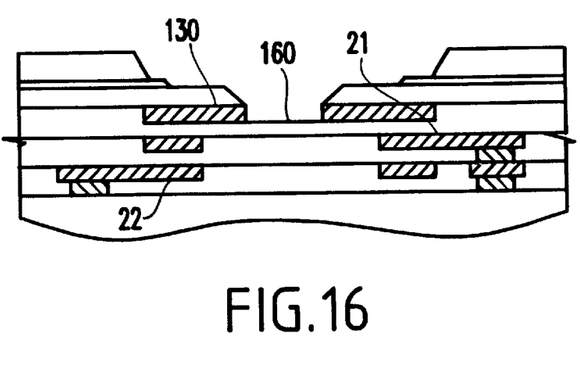
FIG. 16 is a schematic diagram of a side view of an alternative embodiment of the inductive fuse according to the invention.

FIG. 15 is a top view of the device in FIGS. 13 and 14 after the shorted turn 131 has been cut by a conventional laser blow 150. FIG. 16 is a sectional view thru AA of FIG. 14 showing the shorted line open 160. As discussed above, as would be known by one ordinarily skilled in the art, a wide variety of processes may be used to blow the fuse, including conventional laser processes or the inventive etching/ablation process mentioned above.

FIG. 20 illustrates a circuit for sensing an inductance change in the fuse. More specifically, if turn 20 of the fuse is conductive (short circuit) very little AC voltage will develop across transformer turn 22. If turn 20 is non-conductive (open circuit) a much larger AC voltage will develop across transformer turn 22 This larger voltage on turn 22 will be larger than the intermediate AC voltage developed across turn 200. The condition of the fuse (blown or unblown) is detected as the phase of the AC signal at the output of the amplifier 201.

In one exemplary embodiment, when a 6 ma current is applied to a single turn loop inductor having a size equal to $100\mu$ on a side, the primary produces no measurable current in the secondary when the shorted loop is in place and produces a 4 ma current in the secondary when the shorted loop is broken. Thus, the increase in root mean squared (RMS) signal of the circuit will be about 10 mv by blowing the fuse. Therefore, the inventive fuse acts as an "anti-fuse" by preventing current from flowing in an unblown state and allowing current to flow in the blown state.

As described above, the invention alters the inductance of a structure by removing or breaking the shorted turn 20,131. This structure and process is superior to conventional fusing because the shorting turn is opened using processes that do not damage the fragile low K dielectric that is used between wiring layers to gain device electrical performance. It is further superior in that the active fuse link (the link that is opened) is physically isolated from the remainder of the wiring and circuitry on the integrated circuit device and, because of that isolation (and lack of DC bias across the opened fuse) corrosion of the active link after fuse blow has no impact on the state of the blown fuse or impact on other wiring structures on the device.

While the invention has been described in terms of preferred embodiments, those skilled in the art will recognize that the invention can be practiced with modification within the spirit and scope of the appended claims.

What is claimed is:

1. A programming device comprising:
    an inductive circuit in which an inductance is alterable,
    wherein said inductive circuit includes a primary turn, a secondary turn, and
    wherein said programming device comprises a fuse and said shorted turn comprises a fuse link.

2. The programming device in claim 1, wherein removing a portion of said shorted turn changes said inductance.

3. The programming device in claim 1, wherein said secondary turn is positioned between said primary turn and said shorted turn.

4. The programming device in claim 1, wherein a current in said shorted turn prevents coupling between said primary turn and said secondary turn.

5. The programming device in claim 1, wherein said primary turn and said secondary turn include aligned openings and said shorted turn includes a portion extending over said aligned openings.

6. The programming device in claim 1, wherein said shorted turn is isolated from other circuitry.

7. The programming device in claim 1, wherein said shorted turn is insensitive to corrosion.

8. A fuse comprising:
    a primary turn;
    a secondary turn above said primary turn; and
    a shorted turn above said secondary turn,
    wherein removing a portion of said shorted turn changes an inductance of said fuse.

9. The fuse in claim 8, wherein said primary turn comprises a first wire positioned in a first plane, said first wire having two ends and an inner and an outer periphery, said wire having a loop shape such that said two ends are in close proximity to one another.

10. The fuse in claim 9, wherein said secondary turn comprises a second wire position in a second plane, said second wire having two ends and an inner and an outer periphery, said second wire having a loop shape such that said ends are in close proximity to one another, said inner periphery of said second wire aligning substantially over said inner periphery of said first wire and said outer periphery of said second wire aligning substantially over said outer periphery of said first wire.

11. The fuse in claim 10, wherein said shorted turn comprises a third wire contained in a plane having an inner and an outer periphery, and comprising a closed loop, said inner periphery of said third wire aligning substantially over said inner periphery of said second wire and said outer periphery of said third wire aligning substantially over said outer periphery of said second wire.

12. The fuse in claim 11, further comprising a first insulator between said first wire and said second wire and a second insulator on between said second wire and said third wire.

13. The fuse in claim 8, wherein said shorted turn is isolated from other circuitry.

14. The fuse in claim 8, wherein said shorted turn is insensitive to corrosion.

15. A programming device comprising:

an inductive circuit, wherein said inductive circuit includes a primary turn, a secondary turn and a shorted turn, and      wherein said shorted turn comprises a fuse link adapted to alter an inductance of said inductive circuit.

16. The programming device in cliam 15, wherein removing a portion of said shorted turn changes said inductance.

17. The programming device in claim 15, wherein said secondary turn is positioned between said primary turn and said shorted turn.

18. The programming device in claim 15, wherein a current in said shorted turn prevents coupling between said primary turn and said secondary turn.

19. The programming device in claim 15, wherein said primary turn and said secondary turn include aligned openings and said shorted turn includes a portion extending over said aligned openings.

20. The programming device in clain 15, wherein said shorted turn is isolated from other circuitry.

\* \* \* \* \*